United States Patent
Ho et al.

(10) Patent No.: US 8,270,223 B2
(45) Date of Patent: Sep. 18, 2012

(54) MEMORY DEVICE

(75) Inventors: Wen-Chiao Ho, Tainan (TW);
Chin-Hung Chang, Tainan (TW);
Shuo-Nan Hung, Jhubei (TW);
Chun-Hsiung Hung, Hsinchu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 123 days.

(21) Appl. No.: 12/628,710

(22) Filed: Dec. 1, 2009

(65) Prior Publication Data
US 2011/0128786 A1 Jun. 2, 2011

(51) Int. Cl.
*G11C 11/34* (2006.01)
(52) U.S. Cl. .................................. 365/185.23
(58) Field of Classification Search ............... 365/185.23
See application file for complete search history.

(56) References Cited

U.S. PATENT DOCUMENTS

| | | | |
|---|---|---|---|
| 2003/0039143 A1* | 2/2003 | Ogane ..................... | 365/185.23 |
| 2006/0018163 A1* | 1/2006 | Kwon et al. .............. | 365/185.29 |
| 2008/0084750 A1* | 4/2008 | Hosono .................... | 365/185.18 |
| 2008/0279017 A1* | 11/2008 | Shimano et al. ......... | 365/189.06 |

* cited by examiner

*Primary Examiner* — Hoai V Ho
*Assistant Examiner* — Min Huang
(74) *Attorney, Agent, or Firm* — Alston & Bird LLP (57) ABSTRACT

A memory device includes a memory sector including a memory sector, a row of select transistors and a number of drivers. The memory sector includes a plurality of word lines each couples to a plurality of memory cells. The row of select transistors select the memory sector and separate the memory sector from an immediately adjacent memory sector in the memory device. Each of the number of drivers is coupled to one of the plurality of word lines. A first one of the drivers is coupled to a first one of the word lines to receive a first control signal to conduct the first word line and a voltage source, and a second one of the drivers is coupled to a second one of the word lines to receive a second control signal to disconnect the second word line from the voltage source.

11 Claims, 7 Drawing Sheets

MEMORY DEVICE

BACKGROUND OF THE INVENTION

The present invention relates generally to a memory device and, more particularly, to a memory device capable of erasing a sub-sector of memory cells.

Flash memory, which can be electrically erased and reprogrammed, is a type of electrically erasable programmable read-only memory (EEPROM). Since flash memory is non-volatile, no power is needed to retain stored information. In addition, flash memory allows fast read access and large block erasure. These characteristics explain the popularity of flash memory in portable devices such as digital cameras, mobile phones, digital audio players, personal digital assistants (PDAs) and laptop computers.

Flash memory typically stores information in an array of transistors, commonly referred to as "cells," each of which may store one bit of information. Furthermore, flash memory may be erased in "sectors" or "blocks" having a size of, for example, four megabits or eight megabits. That is, information stored in the memory cells of one sector in a flash memory may be erased in a "flash" at the same time. Despite the advantage of sector or block erasure, however, it may be required in some applications to erase a flash memory in a partial sector or a partial block rather than an entire sector(s) or block(s). It may therefore be desirable to have a memory device with a flexible erasure design that allows partial sector erasure as well as entire sector erasure.

BRIEF SUMMARY OF THE INVENTION

Examples of the present invention may provide a memory device that comprises a memory sector including a memory sector, a row of select transistors and a number of drivers. The memory sector includes a plurality of word lines each couples to a plurality of memory cells. The row of select transistors select the memory sector and separate the memory sector from an immediately adjacent memory sector in the memory device. Each of the number of drivers is coupled to one of the plurality of word lines, wherein a first one of the drivers is coupled to a first one of the word lines to receive a first control signal to conduct the first word line and a voltage source, and a second one of the drivers is coupled to a second one of the word lines to receive a second control signal to disconnect the second word line from the voltage source.

Some examples of the present invention may also provide a memory device that comprises a memory sector, a row of select transistors and a number of drivers. The memory sector includes a plurality of word lines each is coupled to a plurality of memory cells. The row of select transistors select the memory sector and separate the memory sector from an immediately adjacent memory sector in the memory device. Each of the number of drivers is coupled to one of the plurality of word lines, wherein a first one of the drivers is coupled to a first one of the word lines to receives a control signal to conduct the first word line and a first voltage source, and a second one of the drivers is coupled to a second one of the word lines to receive the control signal to conduct the second word line and a second voltage source.

Examples of the present invention may provide an erasing method that comprises the steps of coupling a plurality of word lines to a plurality of memory cells; coupling a first driver to a first one of the word lines; providing a first control signal to the first driver to conduct the first word line and a voltage source; coupling a second driver to a second one of the word lines; and providing a second control signal to disconnect the second word line from the voltage source.

Some examples of the present invention may also provide an erasing method that comprises the steps of coupling a plurality of word lines to a plurality of memory cells; coupling a first driver to a first one of the word lines; providing a control signal to the first driver to conduct the first word line and a first voltage source; coupling a second driver to a second one of the word lines; and providing the control signal to the second driver to conduct the second word line and a second voltage source.

Other objects, advantages and novel features of the present invention will be drawn from the following detailed embodiments of the present invention with attached drawings, in which:

BRIEF DESCRIPTION OF THE SEVERAL VIEWS OF THE DRAWINGS

The foregoing summary as well as the following detailed description of the preferred embodiments of the present invention will be better understood when read in conjunction with the appended drawings. For the purposes of illustrating the invention, there are shown in the drawings examples which are presently preferred. It is understood, however, that the invention is not limited to the precise arrangements and instrumentalities shown. In the drawings.

DETAILED DESCRIPTION OF THE INVENTION

Reference will now be made in detail to the present examples of the invention illustrated in the accompanying drawings. Wherever possible, the same reference numbers will be used throughout the drawings to refer to the same or like portions.

Figure 1A:
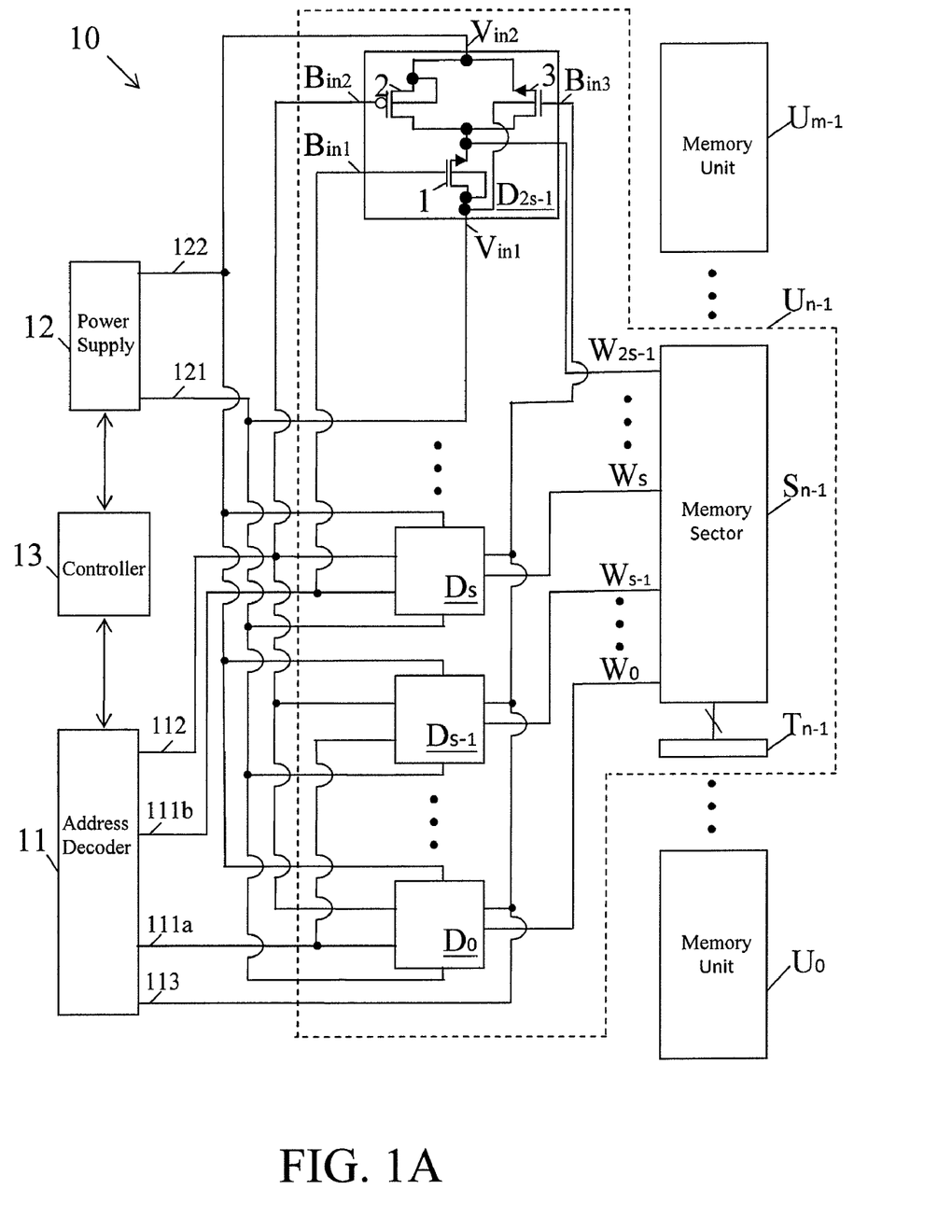
FIG. 1A is a schematic diagram of a memory device in accordance with an example of the present invention.

FIG. 1A is a schematic diagram of a memory device 10 in accordance with an example of the present invention. Referring to FIG. 1, the memory device 10 may include an address decoder 11, a power supply 12, a controller 13 and a number of "m" memory units $U_0, U_1 \ldots U_{n-1} \ldots U_{m-1}$, where n and m are positive integers and n is equal to or smaller than m. Each of the memory units $U_0$ to $U_{m-1}$ may have a similar structure and thus only a representative memory unit $U_{n-1}$ will be discussed.

The representative memory unit $U_{n-1}$ may include a memory sector $S_{n-1}$, a row of select transistors, $T_{n-1}$, and a number of "2s" drivers $D_0$ to $D_{2s-1}$, "s" being a positive integer. The memory sector $S_{n-1}$ may include memory cells arranged in rows and columns. The select transistor row $T_{n-1}$ may be coupled to the memory sector $S_{n-1}$ to select column(s) of the memory cells of the memory sector $S_{n-1}$ and separate the memory sector $S_{n-1}$ from an immediately adjacent memory sector such as $S_{n-2}$ (not shown) in the memory device 10. Each of the drivers $D_0$ to $D_{2s-1}$ may be coupled with a respective row of memory cells of the memory sector $S_{n-1}$ via a respective conductive line, i.e., one of word lines $W_0$ to $W_{2s-1}$. For example, the driver $D_{s-1}$ may be coupled with an (s−1)-th row of memory cells via an (s−1)-th conductive line while the driver D, may be coupled with an s-th row of memory cells via an s-th conductive line $W_s$. Each of the drivers $D_0$ to $D_{2s-1}$ may have a similar structure and thus only a representative driver $D_{2s-1}$ will be discussed.

The representative driver $D_{2s-1}$ may include an output coupled to the conductive line $W_{2s-1}$, and may be configured to receive one of a first control signal and a second control signal at a first bias input $B_{in1}$. In the present example, the first bias input $B_{in1}$ of each of a first half of the drivers, $D_0$ to $D_{s-1}$, may be arranged to receive the first control signal from a first control output 111a of the address decoder 11, and the first bias input of each of a second half of the drivers, D, to $D_{2s-1}$, may be arranged to receive the second control signal from a second control output 111b of the address decoder 11. The first and second control signals, generated by the address decoder 11 under the control of the controller 13, may be different from each other in voltage level so that a first half of the memory cells coupled with the first half of drivers $D_0$ to $D_{s-1}$ via a first half of conductive lines $W_0$ to $W_{s-1}$ may have a first operation state in response to the first control signal, and a second half of the memory cells coupled with the second-half drivers $D_s$ to $D_{2s-1}$ via a second half of conductive lines $W_s$ to $W_{2s-1}$ may have a second operation state in response to the second control signal. The first operation state may include but is not limited to, for example, an erasing state and the second operation state may include, for example, a non-erasing state. As a result, an erasing operation may be conducted for only a portion of the memory sector $S_{n-1}$, i.e., the first half of the memory cells of the memory sector $S_{n-1}$, instead of the entire memory sector $S_{n-1}$.

Furthermore, the representative driver $D_{2s-1}$ may be configured to receive a third control signal at a first voltage input $V_{in1}$. The third control signal, generated by the power supply 12 under the control of the controller 13, may be applied from a first output 121 of the power supply 12 to all of the drivers $D_0$ to $D_{2s-1}$. The third control signal, in conjunction with the first and second control signals, may facilitate a desired operation for a desired sub-sector of the memory sector $S_{n-1}$. In the case of an erasing operation, for example, the third control signal may have a negative voltage level, which will be discussed later. In the erasing state, the word lines are coupled to a negative voltage source. In the non-erasing state, the word lines are under floating condition due to disconnecting from the negative voltage source.

The representative driver $D_{2s-1}$ in implementation may include a first, second and third transistors 1, 2 and 3. In the present example, the first transistor 1, which may be an n-type metal-oxide-semiconductor (NMOS) transistor, may include a gate to serve as the first bias input $B_{in1}$ to receive one of the first and second control signals (in the present example, the second control signal from the second output 111b), a drain to serve as the first voltage input $V_{in1}$ to receive the third control signal, and a source coupled to one of the conductive lines $W_0$ to $W_{2s-1}$ (in the present example, the word line $W_{2s-1}$). The second transistor 2, which may be a p-type metal-oxide-semiconductor (PMOS) transistor, may include a gate to serve as a second bias input $B_{in2}$ coupled to a second output 112 of the address decoder 11, a drain coupled to the conductive line $W_{2s-1}$, and a source to serve as a second voltage input $V_{in2}$ coupled to a second output 122 of the power supply 12. The third transistor 3, which may be an NMOS transistor, may include a gate to serve as a third bias input $B_{in3}$ coupled to a third output 113 of the address decoder 11, a drain coupled to the drain of the second transistor 2, and a source coupled to the source of the second transistor 2. Skilled persons in the art will understand that the source and drain of a transistor may be interchangeable, depending on the voltages applied thereto.

The first-half drivers $D_0$ to $D_{s-1}$ may be similar to the representative driver $D_{2s-1}$ (which is one of the second-half drivers) except that the first gate of each of the first-half drivers $D_0$ to $D_{s-1}$ may be arranged to receive the first control signal from the first output 111a.

Figure 1B:
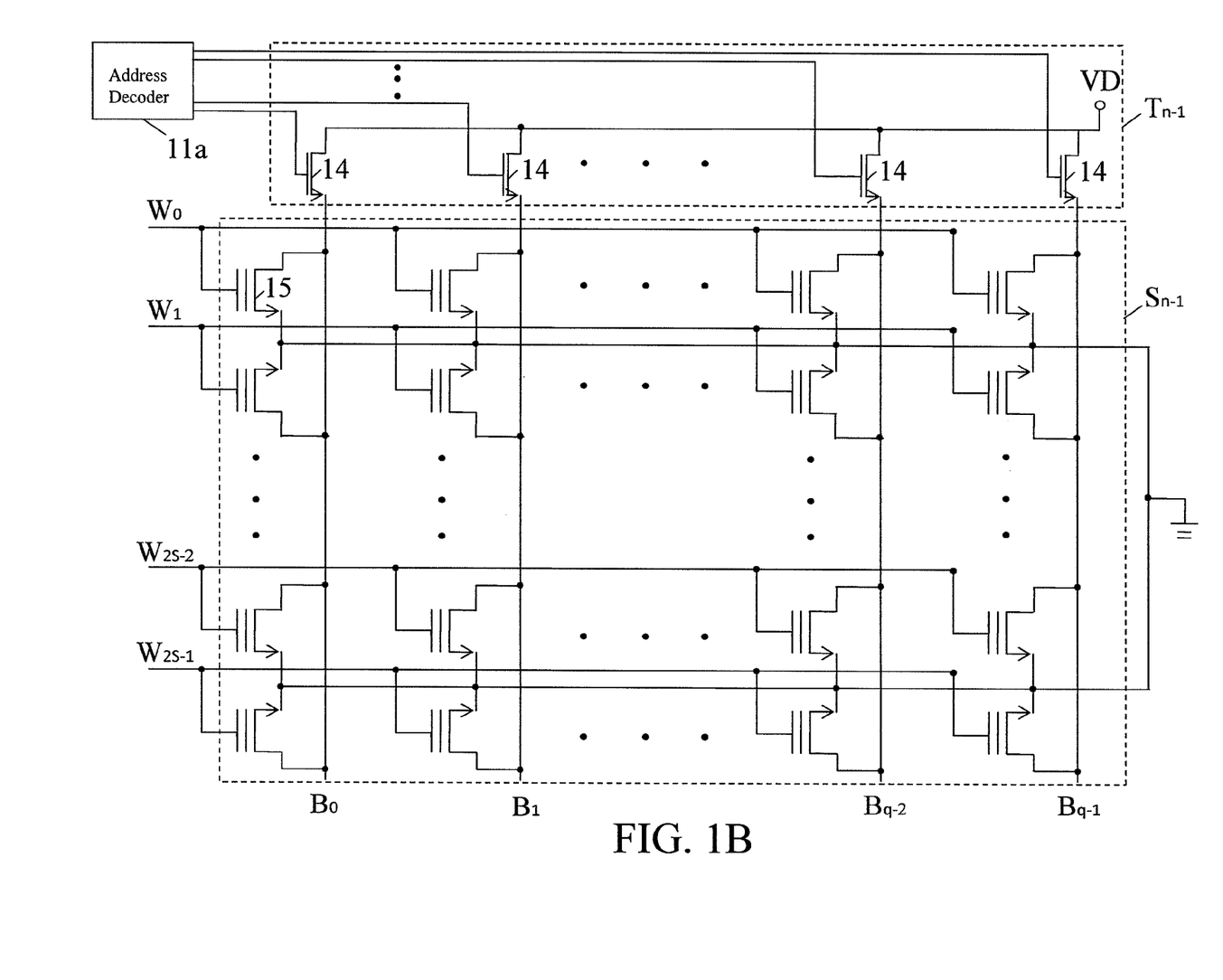
FIG. 1B is a schematic diagram of a memory sector illustrated in FIG. 1A.

FIG. 1B is a schematic diagram of the memory sector $S_{n-1}$ illustrated in FIG. 1A. Referring to FIG. 1B, the memory sector $S_{n-1}$ may include an array of memory cells 15 arranged in "2s" rows and "q" columns, where q is a positive integer. Each of the memory cells 15 for example may include an NMOS transistor. The transistor row $T_{n-1}$ may include a number of "q" transistors 14, which may be NMOS transistors. Each of the transistors 14 may include a source coupled to one of a number of "q" bit lines $B_0$ to $B_{q-1}$, a drain coupled to a predetermined voltage level VD, which corresponding to which operation being executed, and a gate coupled to an address decoder 11a. Furthermore, each of the bit lines $B_0$ to $B_{q-1}$ may be coupled to the drains of a respective column of memory cells 15, while each of the word lines $W_0$ to $W_{2s-1}$ may be coupled to the gates of a respective row of memory cells 15. The memory cells 15 in the memory sector $S_{n-1}$ may be fabricated in a region doped with p-type impurities, i.e., a p-well, which may be electrically coupled to a charge pump (not shown). Moreover, the sources of the memory cells 15 may be grounded.

In operation, for example, to erase the first half of memory cells 15 in the memory sector $S_{n-1}$, the p-well described above may be pumped to a positive voltage level of approximately 4 to 11 volts. Also referring to FIG. 1A, the second and third transistors 2 and 3 of each of the drivers $D_0$ to $D_{2s-1}$ may be turned off by applying appropriate voltages to the second bias input $B_{in2}$, third bias input $B_{in3}$ and second voltage input $V_{in2}$ thereof. Furthermore, the first transistor 1 of each of the first-half drivers $D_0$ to $D_{s-1}$ may be turned on by applying a first control signal with a positive voltage level to the gates $B_{in1}$ in the first-half drivers $D_0$ to $D_{s-1}$, and the first transistor 1 of each of the second-half drivers $D_s$ to $D_{2s-1}$ may be turned off by applying a second control signal with a negative or reference voltage level to the gates $B_{in1}$ in the second-half drivers $D_s$ to $D_{2s-1}$. Moreover, a third control signal with a negative voltage level may be applied to the first transistor 1 of each of the drivers $D_0$ to $D_{2s-1}$. In one example, the negative voltage level of the third control signal may range from approximately −11 to −8 volts, which may, in conjunction with the positive voltage level of the p-well, create an electric field large enough to cause Fowler-Nordheim (FN) tunneling. As a result, the first half of memory cells 15 coupled with the first-half drivers $D_0$ to $D_{s-1}$ via the first-half conductive word lines $W_0$ to $W_{s-1}$ may be erased, while the second half of memory cells 15 coupled with the second-half drivers $D_s$ to $D_{2s-1}$ in which all of the transistors 1, 2 and 3 are turned off may not be erased. In the beginning, the word lines of the cells in connection with the second-half drivers $D_s$ to $D_{2s-1}$ may be under an electrical-floating condition due to the turn-off of the corresponding transistors 1, 2 and 3. Subsequently, the floating word lines may be coupled to a certain positive high voltage through the oxide-capacitor between the word lines and the P-well when the P-well is pumped to a positive voltage during the erase phase. As a result, the cells in connection with the second-half drivers are not erased.

Although in the present example the drivers $D_0$ to $D_{2s-1}$ are divided into the first half and the second half equal to each other in number, in other examples, however, the drivers $D_0$ to $D_{2s-1}$ may include at least a first set of drivers and a second set of drivers not equal to each other in number. Furthermore, the first set of drivers and the second set of drivers may be interleaved with respect to one another.

Figure 2:
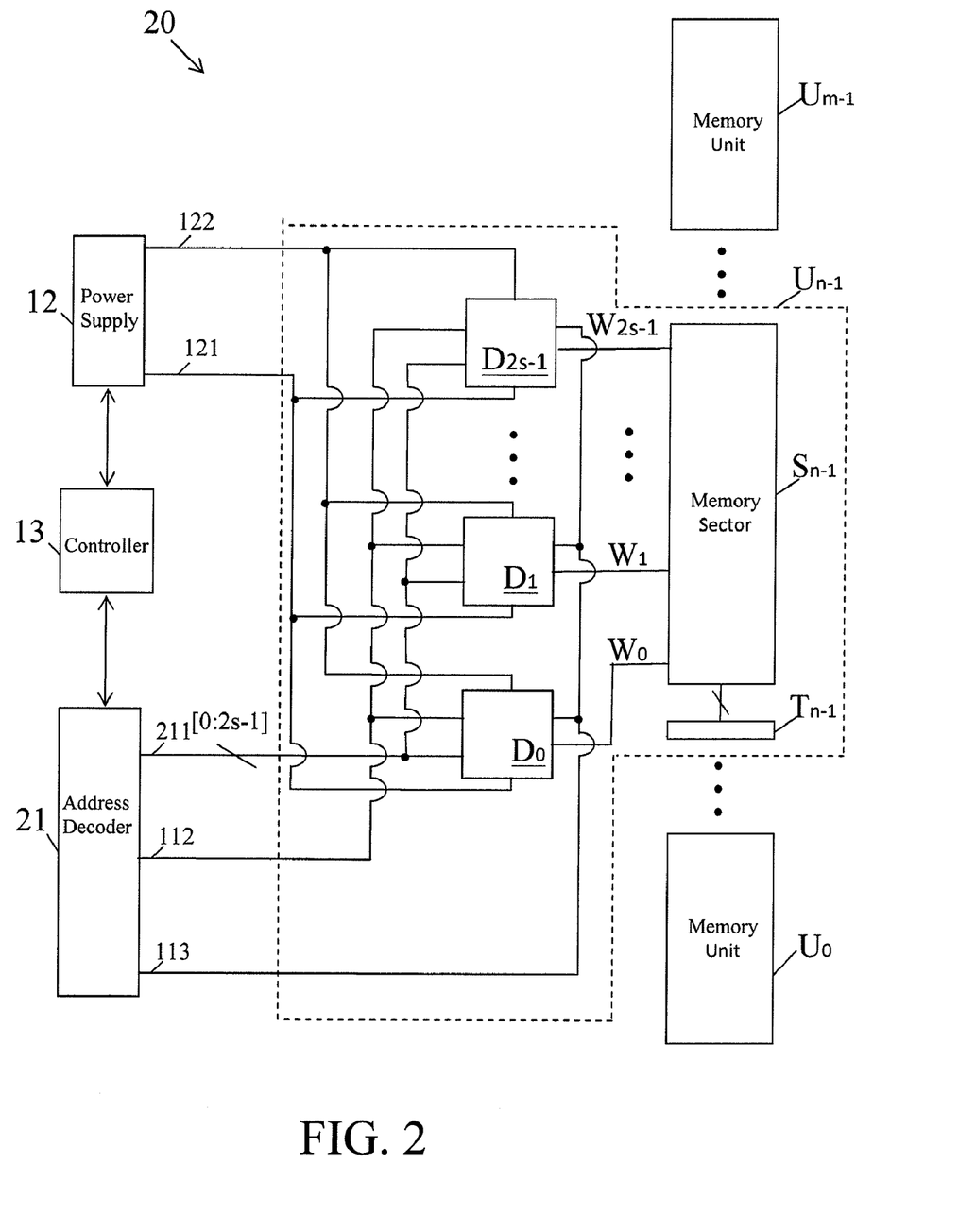
FIG. 2 is a schematic diagram of a memory device in accordance with another example of the present invention.

FIG. 2 is a schematic diagram of a memory device 20 in accordance with another example of the present invention. Referring to FIG. 2, the memory device 20 may be similar to the memory device 10 described and illustrated with reference to FIG. 1A except that, for example, each of the drivers $D_0$ to $D_{2s-1}$ may be configured to receive a respective one of the first and second control signals via a respective line [0:2s−1] from a port 211 of an address decoder 21. Specifically, the gate $B_{in1}$ of the first transistor 1 of each of the drivers $D_0$ to $D_{2s-1}$ may be independently biased by the first or second control signal. Accordingly, at least a first one of the drivers $D_0$ to $D_{2s-1}$ may be configured to receive the first control signal at its first bias input $B_{in1}$ and at least a second one of the drivers $D_0$ to $D_{2s-1}$ may be configured to receive the second control signal at its first bias input $B_{in1}$ so that at least a first row of the memory cells coupled with the at least one first driver via at least a first one of the conductive lines $W_0$ to $W_{2s-1}$ has a first operation state in response to the first control signal and at least a second row of the memory cells coupled with the at least one second driver via at least a second one of the conductive lines $W_0$ to $W_{2s-1}$ has a second operation state in response to the second control signal.

Figure 3:
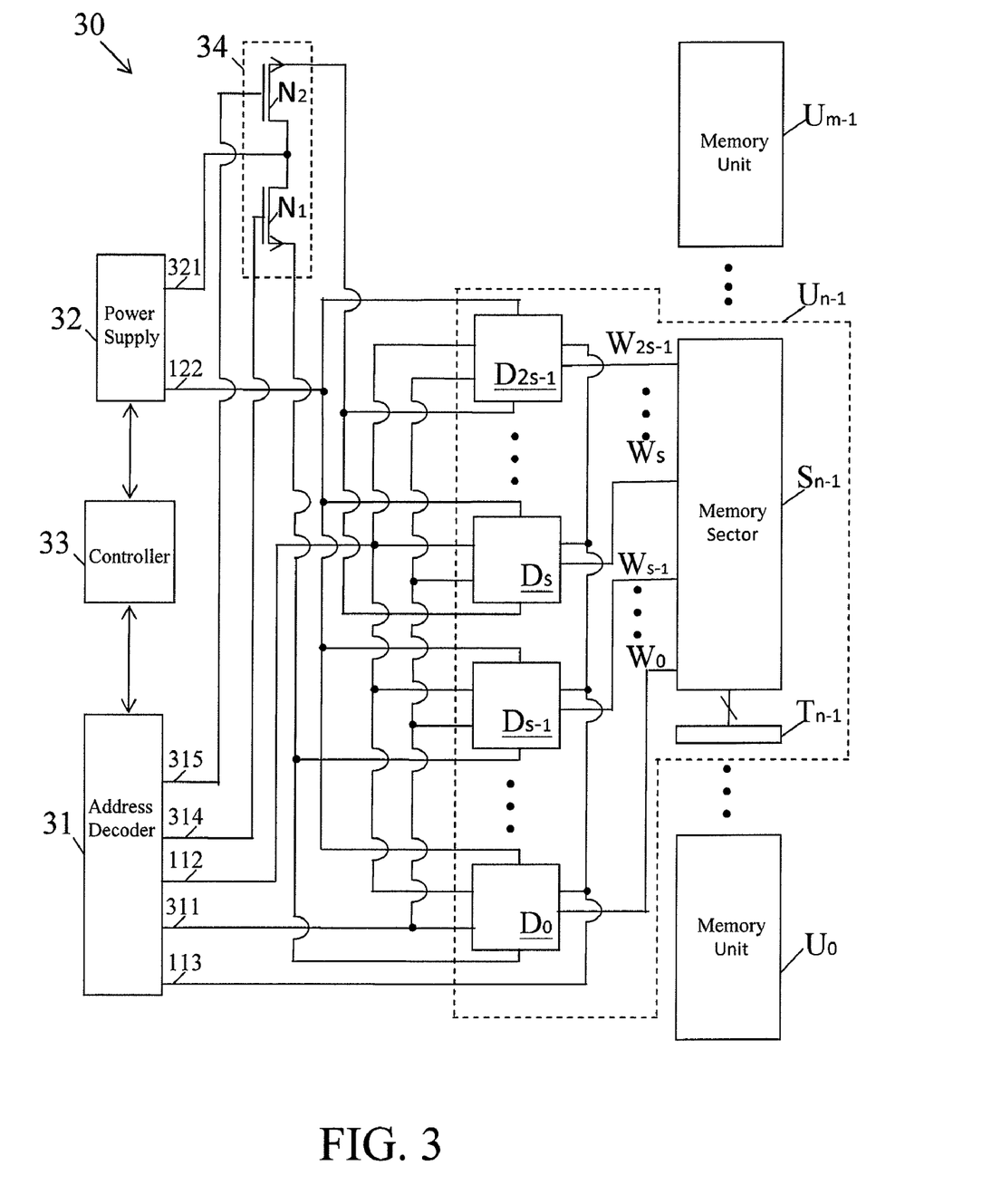
FIG. 3 is a schematic diagram of a memory device in accordance with still another example of the present invention.

FIG. 3 is a schematic diagram of a memory device 30 in accordance with still another example of the present invention. Referring to FIG. 3, the memory device 30 may include an address decoder 31, a power supply 32, a controller 33 and a switch 34 in addition to the drivers $D_0$ to $D_{2s-1}$, the word lines $W_0$ to $W_{2s-1}$ and the memory units $U_0$ to $U_{m-1}$. Each of the drivers $D_0$ to $D_{2s-1}$ may be configured to receive one of a first control signal and a second control signal from the switch 34 at the first voltage input $V_{in1}$ and receive a third control signal from a first output 311 of the address decoder 31 at the first bias input $B_{in1}$. In the present example, the switch 34 may be configured to provide the first control signal to the first-half drivers $D_0$ to $D_{s-1}$ and the second control signal to the second-half drivers $D_s$ to $D_{2s-1}$. Furthermore, the switch 34 may include a first NMOS transistor $N_1$ and a second NMOS transistor $N_2$. The first NMOS transistor $N_1$ may include a gate coupled to a fourth output 314 of the address decoder 31, a source through which the first control signal is provided to the first voltage inputs $V_{in1}$ in the first-half drivers $D_0$ to $D_{s-1}$, and a drain coupled to a second output 321 of the power supply 32. The second NMOS transistor $N_2$ may include a gate coupled to a fifth output 315 of the address decoder 31, a source through which the second control signal is provided to the first voltage inputs $V_{in1}$ in the second-half drivers $D_s$ to $D_{2s-1}$, and a drain coupled to the second output 321 of the power supply 32.

In operation, for example, to erase the first half of memory cells 15 in the memory sector $S_{n-1}$, the p-well in which the memory cells 15 are fabricated may be pumped to a positive voltage level and the second and third transistors 2 and 3 of each of the drivers $D_0$ to $D_{2s-1}$ may be turned off by applying appropriate voltages to the second bias input $B_{in2}$, third bias input $B_{in3}$ and second voltage input $V_{in2}$ thereof. Furthermore, the first transistor 1 of each of the drivers $D_0$ to $D_{2s-1}$ may be turned on by applying a third control signal with a positive voltage level to the gates $B_{in1}$ in the drivers $D_0$ to $D_{2s-1}$. Moreover, a first control signal with a negative voltage level of approximately −11 to −8 volts may be applied to the first voltage input $V_{in1}$ of each of the first-half drivers $D_0$ to $D_{s-1}$, and a second control signal with a positive or reference voltage level may be applied to the first voltage input $V_{in1}$ of each of the second-half drivers $D_s$ to $D_{2s-1}$. As previously discussed, the negative voltage level of the first control signal may cause FN tunneling and the voltage level of the second control signal may not be large enough to cause FN tunneling. As a result, the first half of memory cells 15 coupled with the first-half drivers $D_0$ to $D_{s-1}$ via the first-half conductive lines $W_0$ to $W_{s-1}$ may be erased, while the second half of memory cells 15 coupled with the second-half drivers $D_s$ to $D_{2s-1}$ may not be erased.

In one example, one of the first and second NMOS transistors $N_1$ and $N_2$ may be turned off while the other one may be turned on such that one of the first and second control signals may be at a floating status. A control signal at the floating status is not able to cause the FN tunneling.

Figure 4:
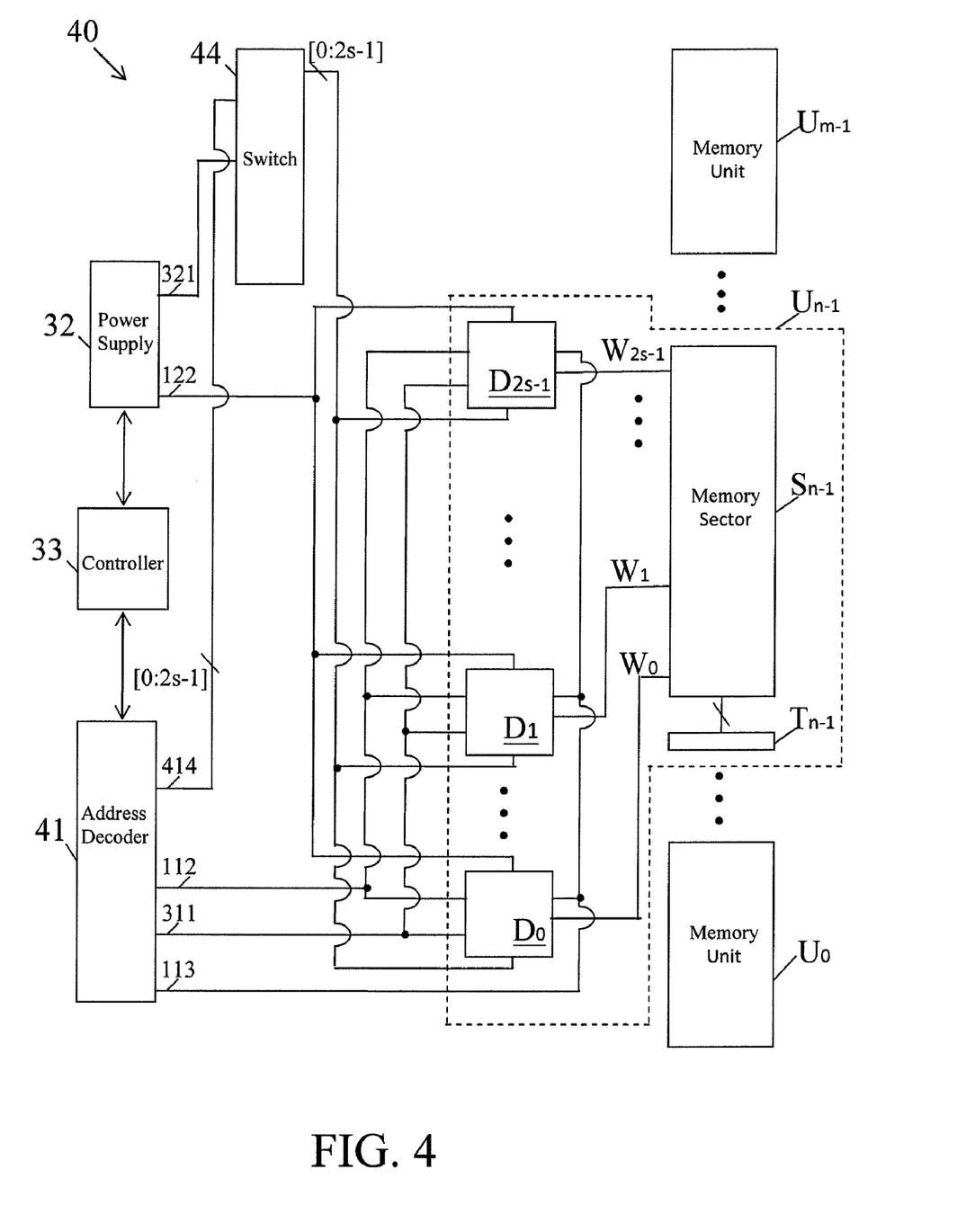
FIG. 4 is a schematic diagram of a memory device in accordance with yet another example of the present invention.

FIG. 4 is a schematic diagram of a memory device 40 in accordance with yet another example of the present invention. Referring to FIG. 4, the memory device 40 may be similar to the memory device 30 described and illustrated with reference to FIG. 3 except that, for example, each of the drivers $D_0$ to $D_{2s-1}$ may be configured to receive a respective one of the first and second control signals via a respective line [0:2s−1] from a switch 44. The switch 44 may include a number of "2s" NMOS transistors each of which includes a gate coupled to an output port 414 via a respective line [0:2s−1]. Accordingly, the gate $B_{in1}$ of the first transistor 1 of each of the drivers $D_0$ to $D_{2s-1}$ may be independently biased by the first or second control signal. As a result, at least a first one of the drivers $D_0$ to $D_{2s-1}$ may be configured to receive the first control signal at its first voltage input $V_{in1}$ and at least a second one of the drivers $D_0$ to $D_{2s-1}$ may be configured to receive the second control signal at its first voltage input $V_{in1}$ so that at least a first row of the memory cells coupled with the at least one first driver via at least a first one of the conductive lines $W_0$ to $W_{2s-1}$ has a first operation state in response to the first control signal and at least a second row of the memory cells coupled with the at least one second driver via at least a second one of the conductive lines $W_0$ to $W_{2s-1}$ has a second operation state in response to the second control signal.

Figure 5:
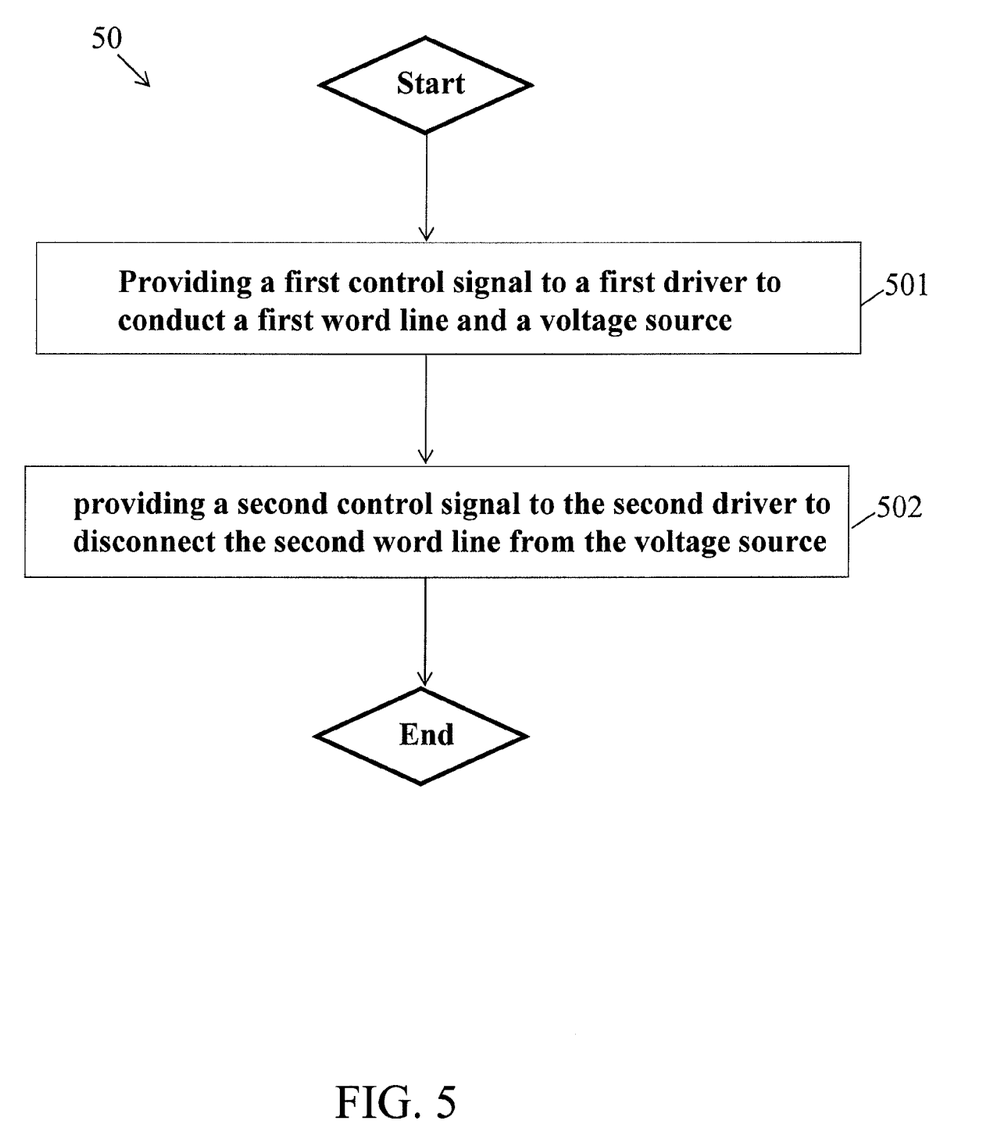
FIG. 5 is a flow diagram illustrating an erasing operation method of a memory in accordance with another example of the present invention.

FIG. 5 is a flow diagram illustrating an erasing operation method of a memory in accordance with another example of the present invention. Referring to FIG. 5, an erasing operation method 50 of a memory may include the following steps. At step 501, a first control signal may be provided to a first driver to conduct the a word line and a voltage source. Next, a second control signal may be provided to a second driver to disconnect a second word line from the voltage source at step 502.

Figure 6:
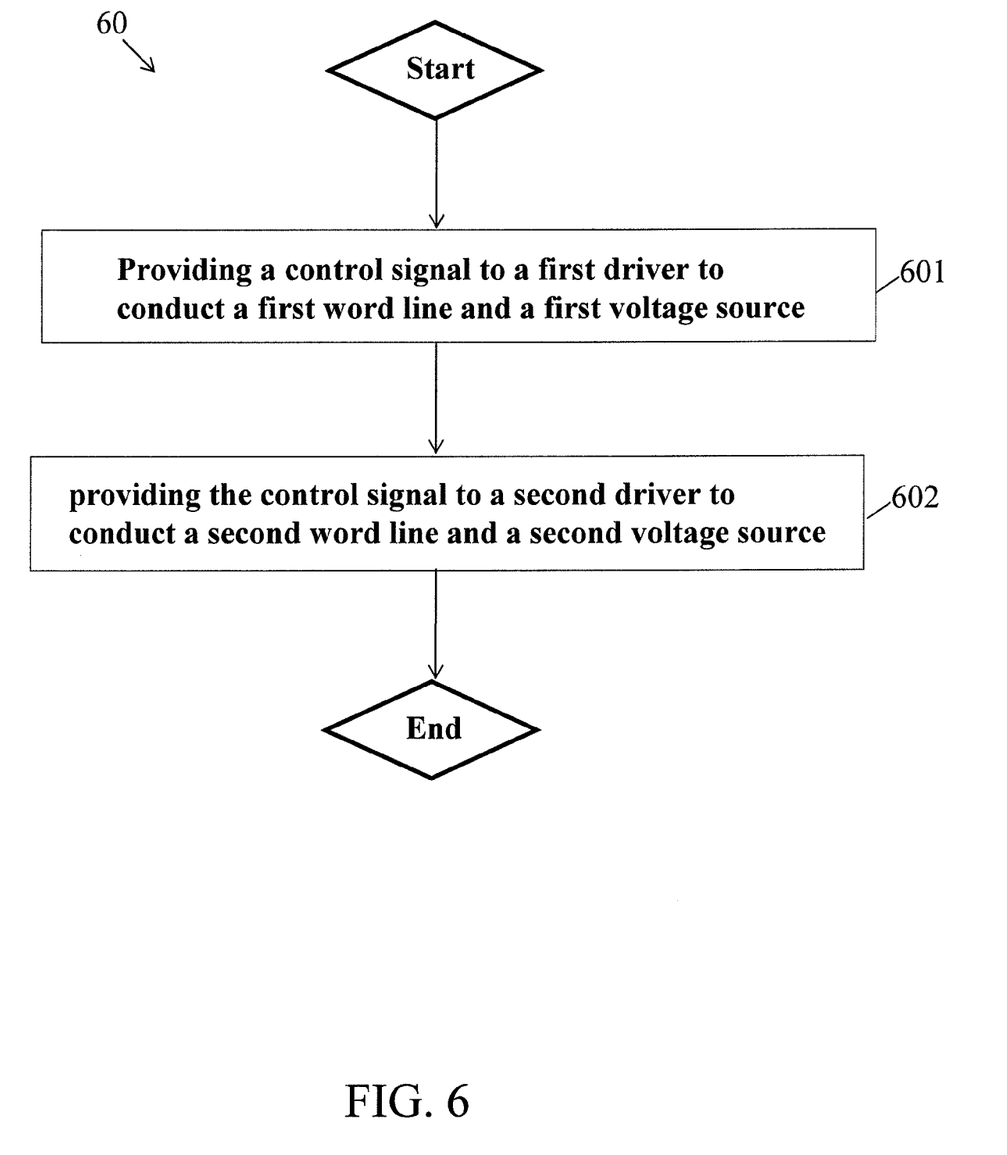
FIG. 6 is a flow diagram illustrating an erasing operation method of a memory in accordance with yet another example of the present invention.

FIG. 6 is a flow diagram illustrating an erasing operation method of a memory in accordance with yet another example of the present invention. Referring to FIG. 6, an erasing operation method 60 of a memory may include the following steps. At step 601, a control signal may be provided to a first driver to conduct a first word line and a first voltage source. Next, the control signal may be provided to the second driver to conduct a second word line and a second voltage source at step 602, wherein the first voltage source is different from the second voltage source.

In describing representative examples of the present invention, the specification may have presented the method and/or process of operating the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

It will be appreciated by those skilled in the art that changes could be made to the examples described above without departing from the broad inventive concept thereof. It is understood, therefore, that this invention is not limited to the particular examples disclosed, but it is intended to cover modifications within the spirit and scope of the present invention as defined by the appended claims.

We claim:

1. A memory device comprising:
a memory sector including a plurality of word lines each coupled to a plurality of memory cells;
a row of select transistors to select the memory sector and separate the memory sector from an immediately adjacent memory sector in the memory device; and
a number of drivers each of which is coupled to one of the plurality of word lines, wherein a first one of the drivers is coupled to a first one of the word lines to receive a first control signal to conduct the first word line and a voltage source with a negative voltage for erasing ones of the plurality of memory cells which are coupled to the first word line, and a second one of the drivers is coupled to a second one of the word lines to receive a second control signal to disconnect the second word line from the voltage source,
wherein each of the drivers includes a first transistor, a second transistor and a third transistor each of which further includes a gate, a source and a drain, wherein the sources of the second and third transistors are directly coupled to each other, and the drains of the second and third transistors are coupled to each other and then to the source of the first transistor, and wherein the gate of the first transistor of each of the drivers is arranged to receive one of the first control signal and the second control signal and the drain of the first transistor of each of the drivers is arranged to receive a third control signal with a negative voltage level for erasing ones of the plurality of memory cells which are coupled to a word line corresponding to the respective one of the drivers in response to the first control signal.

2. The memory device of claim 1, wherein a first half of the drivers are configured to receive the first control signal and a second half of the drivers are configured to receive the second control signal.

3. The memory device of claim 1, wherein the gate of the first transistor of each of a first half of the drivers is arranged to receive the first control signal and the gate of the first transistor of each of a second half of the drivers is arranged to receive the second control signal, and the drain of the first transistor of each of the drivers is arranged to receive a third control signal with a negative voltage level for erasing ones of the plurality of memory cells which are coupled to word lines corresponding to the first half of the drivers in response to the first control signal.

4. The memory device of claim 1, wherein the drain of the first transistor of each of the drivers is arranged to receive one of the first control signal and the second control signal and the gate of the first transistor of each of the drivers is arranged to receive a third control signal.

5. The memory device of claim 1, wherein the drain of the first transistor of each of a first half of the drivers is arranged to receive the first control signal and the drain of the first transistor of each of a second half of the drivers is arranged to receive the second control signal, and the gate of the first transistor of each of the drivers is arranged to receive a third control signal.

6. A memory device comprising:
a memory sector including a plurality of word lines each coupled to a plurality of memory cells;
a row of select transistors to select the memory sector and separate the memory sector from an immediately adjacent memory sector in the memory device;
a number of drivers each of which is coupled to one of the plurality of word lines, wherein a first one of the drivers is coupled to a first one of the word lines to receive a first control signal to conduct the first word line and a voltage source with a negative voltage for erasing ones of the plurality of memory cells which are coupled to the first word line, and a second one of the drivers is coupled to a second one of the word lines to receive a second control signal to disconnect the second word line from the voltage source, wherein each of the drivers includes a first transistor, a second transistor and a third transistor each of which further includes a gate, a source and a drain, wherein the sources of the second and third transistors are directly coupled to each other, and the drains of the second and third transistors are coupled to each other and then to the source of the first transistor; and
a first switch transistor and a second switch transistor each of which further includes a gate, a source and a drain, the source of the first switch transistor is coupled to the drain of the first transistor of each of a first half of the drivers and arranged to transmit the first control signal, the source of the second switch transistor is coupled to the drain of the first transistor of each of a second half of the drivers and arranged to transmit the second control signal, wherein one of the first and second switch transistors is turned off such that one of the first and second control signals is at a floating status.

7. The memory device of claim 6, wherein a first half of the drivers are configured to receive the first control signal and a second half of the drivers are configured to receive the second control signal.

8. The memory device of claim 6, wherein the gate of the first transistor of each of the drivers is arranged to receive one of the first control signal and the second control signal and the drain of the first transistor of each of the drivers is arranged to receive a third control signal with a negative voltage level for erasing ones of the plurality of memory cells which are coupled to a word line corresponding to the respective one of the drivers in response to the first control signal.

9. The memory device of claim 6, wherein the gate of the first transistor of each of a first half of the drivers is arranged to receive the first control signal and the gate of the first transistor of each of a second half of the drivers is arranged to receive the second control signal, and the drain of the first transistor of each of the drivers is arranged to receive a third control signal with a negative voltage level for erasing ones of the plurality of memory cells which are coupled to word lines corresponding to the first half of the drivers in response to the first control signal.

10. The memory device of claim 6, wherein the drain of the first transistor of each of the drivers is arranged to receive one of the first control signal and the second control signal and the gate of the first transistor of each of the drivers is arranged to receive a third control signal.

11. The memory device of claim 6, wherein the drain of the first transistor of each of a first half of the drivers is arranged to receive the first control signal and the drain of the first transistor of each of a second half of the drivers is arranged to receive the second control signal, and the gate of the first transistor of each of the drivers is arranged to receive a third control signal.

* * * * *